(12) United States Patent
Liu et al.

(10) Patent No.: US 6,890,772 B2
(45) Date of Patent: May 10, 2005

(54) METHOD AND APPARATUS FOR DETERMINING TWO DIMENSIONAL DOPING PROFILES WITH SIMS

(75) Inventors: Chin-Kai Liu, Hsin-Chu (TW);
Jun-Yean Chiou, Taichung (TW);
Pei-Fen Chou, Hsin Chu (TW);
Han-Shun Lui, Hsin Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 369 days.

(21) Appl. No.: 10/043,734

(22) Filed: Jan. 9, 2002

(65) Prior Publication Data

US 2003/0127601 A1 Jul. 10, 2003

(51) Int. Cl.[7] ............................ G01R 31/26; H01L 21/66
(52) U.S. Cl. ...................... 438/14; 438/18; 250/370.14; 250/306; 324/71.5; 324/719
(58) Field of Search ................ 438/14, 18; 250/370.14, 250/306; 324/71.5, 719

(56) References Cited

U.S. PATENT DOCUMENTS

| | | | | |
|---|---|---|---|---|
| 5,140,164 A | * | 8/1992 | Talbot et al. | ............. 250/492.2 |
| 5,248,376 A | * | 9/1993 | Saito | .......................... 117/106 |
| 6,172,399 B1 | * | 1/2001 | Lee et al. | .................... 257/336 |
| 6,483,594 B2 | * | 11/2002 | Borden et al. | .............. 356/502 |

* cited by examiner

Primary Examiner—W. David Coleman
Assistant Examiner—Khiem D Nguyen
(74) Attorney, Agent, or Firm—Tung & Associates

(57) ABSTRACT

A method of forming a SIMS monitor device for determining a doping profile of a semiconductor device structure including providing a plurality of regularly repeating semiconductor structures including a doping profile to form a monitor device including at least one layer of the regularly repeating semiconductor structures; planarizing the monitor device through a thickness of the regularly repeating semiconductor structures to reveal a target surface overlying the doping profile to form a monitor pattern; and, sputtering the target surface over a sputtering area including the monitor pattern through a thickness thereof while simultaneously detecting and counting over a time interval at least one type of species ejected from the target surface according to a secondary ion mass spectroscopy procedure (SIMS).

19 Claims, 2 Drawing Sheets

METHOD AND APPARATUS FOR DETERMINING TWO DIMENSIONAL DOPING PROFILES WITH SIMS

FIELD OF THE INVENTION

This invention generally relates to a method and apparatus for determining a doping profile and more particularly to a method and apparatus for using a SIMS procedure to determine a doping profile for a semiconductor device structure.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

In the semiconductor manufacturing process several different devices employ doping of a particular region to alter its electrical characteristics. For example, the well known complimentary metal oxide semiconductor (CMOS) technology in manufacturing, for example, relies on doping to manufacture n-channel (NMOS) and p-channel (PMOS) structures that are widely used in manufacturing for example, transistor and memory devices such as dynamic random access memory (DRAM) and static random access memory (SRAM). As device features become increasingly smaller, the required doping specifications are increasingly stringent.

Although there have been several electrical measurement methods proposed to measure doping profiles of semiconductor structures such as, for example, Current-Voltage (CV) methods, these methods are unable to determine doping concentration as a function of depth with sufficient resolution. Other methods have also had limited success in obtaining a doping concentration profile of sufficient resolution as a function of depth, leaving the best potential method in terms of element detection limit and depth resolution as secondary ion mass spectroscopy (SIMS). SIMS is the method of choice for surface and near surface investigation of solid samples because of its ability to provide parts-per-million to parts-per-billion sensitivity and excellent depth resolution.

SIMS is a well known a technique for surface and near surface analysis which involves ion bombardment of the sample surface for depth profiling. Primary ions are accelerated by a voltage bias to bombard the target surface where they are implanted, resputtered, and produce sputtered secondary ions from the target material. The secondary ions are separated depending on mass and detected and counted by a detector. As the process proceeds, the target surface is gradually removed according to a sputter rate depending on, for example, primary beam intensity, sample material, and crystal orientation. Typical sputter rates of 2–5 Angstroms per second, at data acquisition time intervals of 0.5–10 seconds, produce typical depth increments in the 20–50 Angstrom range. The primary ion beam species that are typically useful in SIMS analysis include $Cs^+$, $O^{2+}$, $O^-$, $Ar^+$, and $Ga^+$ at energies between 1 and 30 keV.

The sputtered ions are collected by a mass spectrometer for mass to charge separation and detection. The number of ions collected can also be digitally counted and integrated to produce quantitative data on the sample composition. By monitoring the secondary ion signals with time (sputter depth), a dopant concentration depth profile can be produced.

One problem with applying SIMS in the analysis of semiconductor structures is the large analytical area of about 100 microns by about 100 microns. As a result, SIMS has not been able to measure doping profiles of individual semiconductor structures as a function of depth (i.e., a two-dimensional profile). As such, the use of SIMS has been largely restricted to one dimensional analysis in the semiconductor art, where the surface dopant concentration over the analytical area is determined.

One example where a two dimensional doping concentration analysis is required is in a lightly doped drain (LDD) structure. In scaling down devices, thinner gate oxide and more highly doped channels are needed to increase the punch-through voltage. As a result, the electric field near the drain regions can cause hot charge carriers to penetrate the oxide barrier into the gate thereby degrading device performance.

An LDD structure alleviates this problem by including a lightly doped region near the gate while allowing a heavier doping concentration in the region further from the gate. Generally described, an LDD structure in an NMOS or PMOS device includes a gate with oxide sidewall spacers. The LDD region is below the sidewall spacers adjacent to, for example in an NMOS device, a P doped substrate known as a P-well. The doping region between oxide gates is first subjected to a lighter doping dose of for example, phosphorous, prior to forming the oxide sidewall spacers adjacent to the gate structure. The sidewall spacers act to shield a portion of the previously doped doping region while the doping region is again subjected to a second heavier doping dose of, for example, arsenic. The two doping regions formed include a more lightly doped region near the gate structure under the sidewall spacers and a more highly doped region displaced from the gate edge. Thus, the electric field is reduced near the gate thereby alleviating the problem of hot charge carrier penetration into the gate.

While there are several methods for carrying out doping by, for example, implantation methods, as feature sizes shrink, channeling of implanted ions is more likely to adversely affect device performance making it critical to carry out implanting at the proper energies and intensities. As such, device performance depends heavily on gauging the precision in the level of doping and its spatial profile. As yet, no satisfactory methods have been developed to allow the use of SIMS to analyze the doping profiles of individual submicron semiconductor features in two dimensions.

There is therefore a need in the semiconductor processing art to develop a method and apparatus whereby two dimensional doping profiles using SIMS can be obtained for individual semiconductor features thereby allowing doping concentrations to be spatially determined (doping profile) with improved precision in a semiconductor device structure doping region.

It is therefore an object of the invention to provide a method and apparatus whereby two dimensional doping profiles for semiconductor device structures using SIMS can be determined thereby allowing doping concentrations to be spatially characterized with improved precision in a semiconductor device doping region while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a SIMS monitor device for determining a doping profile of a semiconductor device structure according to a SIMS procedure and further, provides a monitor device for analysis of a doping profile of an individual semiconductor device structure according to a SIMS procedure.

In a first embodiment according to the present invention, a method is provided for forming a SIMS monitor device for determining a doping profile of a semiconductor device structure including the steps of providing a plurality of regularly repeating semiconductor structures including a doping profile to form a monitor device including at least one layer of the regularly repeating semiconductor structures; planarizing the monitor device through a thickness of the regularly repeating semiconductor structures to reveal a target surface overlying the doping profile to form a monitor pattern; and sputtering the target surface over a sputtering area including the monitor pattern through a thickness thereof while simultaneously detecting and counting over a time interval at least one type of species ejected from the target surface.

In related embodiments, the monitor pattern further comprises a regularly repeating pattern in at least two dimensions. Further, the planarizing step further comprises a chemical mechanical polishing (CMP) step. Further yet, the target surface comprises a polysilicon substrate including the doping profile.

In another embodiment according to the present invention, the monitor device further comprises multiple layers of the regularly repeating semiconductor structures. Further, the steps of planarizing and sputtering are carried out for at least one layer of the multiple layers.

Another aspect according to the present invention further includes the step of determining the doping profile.

In a related embodiment, the target surface has an area sufficient to include the sputtering area. Further, the regularly repeating semiconductor structures include CMOS structures and memory structures.

In other related embodiments, the monitor pattern forms regularly repeating rows. Further, the monitor pattern forms regularly repeating rows of regularly repeating rectangles.

According to yet another embodiment of the invention, there is provided a monitor device for analysis of a doping profile of an individual semiconductor device structure according to a SIMS procedure including a planar surface intersecting a plurality of regularly repeating semiconductor structures including a doping profile to form a target surface said regularly repeating semiconductor structures included in at least one layer of the monitor device said monitor device being mountable in a secondary ion mass spectrometer for sputtering the target surface through a thickness to determine the doping profile.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

By example only, an exemplary application of the present invention is explained in detail by reference to exemplary semiconductor structures, it being understood that the present invention is applicable to a wide variety of semiconductor structures whereby a two dimensional doping profile may be advantageously obtained using SIMS according to the present invention.

Figure 1:
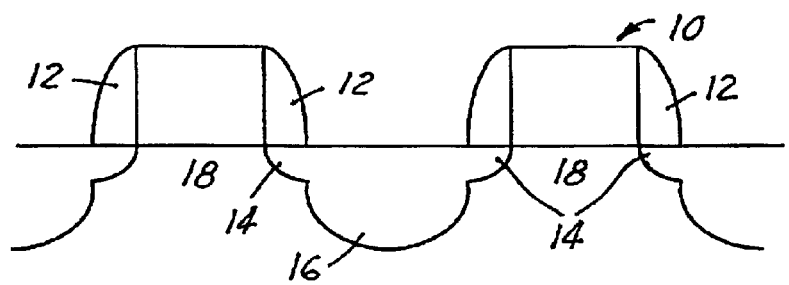
FIG. 1 is a cross sectional side view representation of an LDD NMOS semiconductor structure.

For example, FIG. 1 is a cross sectional view of an exemplary NMOS device including an LDD structure. For example, gate 10 with oxide sidewall spacers 12 includes an LDD region 14 below the sidewall spacers 12 adjacent to a P-doped silicon substrate P-well 18. The silicon S/D doping region 16, including LDD region 14 is first subjected to a lighter doping dose of, for example, phosphorous, of about 1 to $5 \times 10^{13}$ atoms per $cm^2$ prior to forming the oxide spacers 12. The S/D doping region 16 is then subjected to a second heavier doping dose with, for example, arsenic of about 1 to $5 \times 10^{15}$ atoms per $cm^2$ after formation of the oxide spacers 12, creating an $N^-$ LDD region 14 and a $N^+$ S/D doping region 16. The oxide sidewall spacers 12, including for example, silicon oxide, are formed by a conventional deposition and etching procedures, for example, chemical vapor deposition (CVD) and reactive ion etching, which are well known in the art. The LDD region 14 enables the depth of S/D doping region 16 to be greater providing the added benefits of, for example, decreased contact and sheet resistance. As such, device performance depends heavily on precision in the level of doping and its spatial profile.

Figure 2:
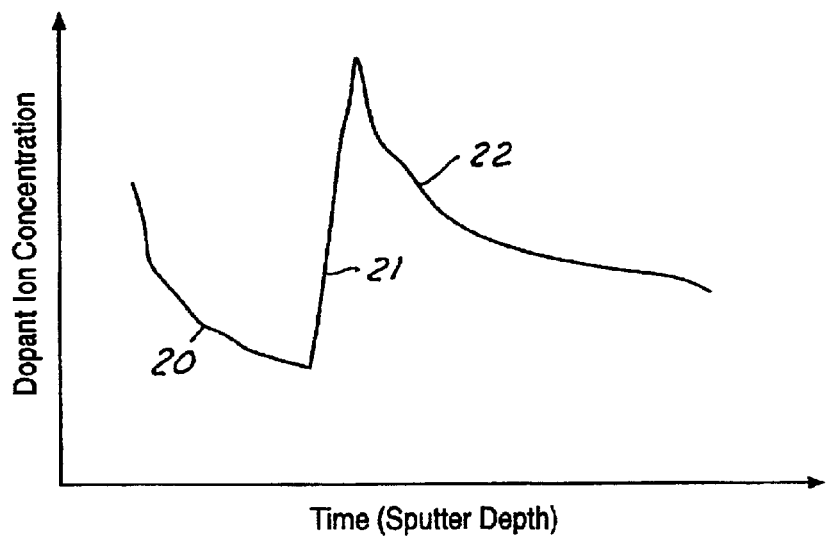
FIG. 2 is a graphical representation of SIMS data showing a doping profile across LDD NMOS semiconductor structure.

According to the prior art, however, SIMS has not been useful for analyzing two dimensional doping profiles over an individual short-channel semiconductor structure such as, for example, an LDD structure. The conventional analytical area for SIMS, according to the prior art, covers an area of about 100×100 microns. FIG. 2, for example, shows a doping profile that would be obtained by SIMS over sputter area represented by line A—A in FIG. 1 providing the SIMS primary beam covered a sufficiently small analytical area.

In FIG. 2, the vertical axis represents a total integrated count of the species selected for detection, for example, phosphorous and arsenic, while the horizontal axis represents sputtering time. As the surface is sputtered through a thickness of the structure over, for example, area A—A, the two-dimension doping profile shown by line 20 where sputtering takes place over the LDD doping area followed by a transition 21 to line 22 where sputtering takes place over the S/D doping area would result. It will be appreciated that sputtering and detection takes place over the entire analytical area and represents cumulative count of the dopant ion(s) selected for detection as opposed to a scanning process.

According to the present invention, a series of representative semiconductor structures, for example, an NMOS source/drain (S/D) structure with an LDD region, are designed and formed with a well defined repeating pattern including substantially identical devices to form a monitor pattern. The monitor pattern is preferably included in a monitor device which may include multiple thickness layers with the repeating device patterns formed in each layer of the device. Preferably the monitor device includes an area within a range from about 100 microns by 100 microns to about 500 microns by 500 microns, more preferably about 300 microns by about 300 microns.

Figure 3A:
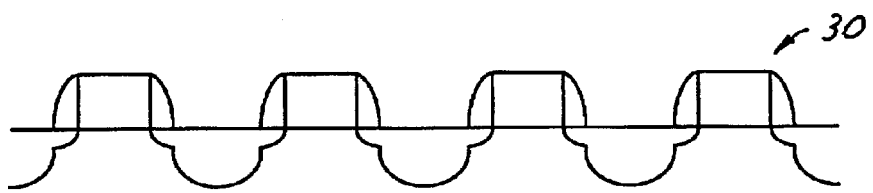
FIGS. 3A–3B are cross-sectional side view representations of a regularly repeating LDD NMOS semiconductor structure at different stages according to the present invention.

For example, FIG. 3A, depicts an exemplary cross section of a side view of a portion of a monitor device with a repeating pattern 30 of LDD NMOS semiconductor devices in an exemplary layer. It will be appreciated that the monitor device may include only one layer of repeating device patterns or multiple layers with either the same or another repeating pattern.

Figure 3B:

Referring to FIG. 3B, according to the present invention, the monitor device, after completing the manufacture of the repeating pattern of semiconductor structures included in the monitor device, is subjected to, for example, a chemical mechanical polish (CMP) procedure whereby the monitor device is polished back to a thickness to reveal a target surface 32 corresponding to that thickness at about where a doping profile e.g., 36 begins. Preferably, the target surface includes the polysilicon layer, for example, P-doped substrate including P-well 38, LDD area 36, and the more heavily doped S/D doping region 34.

Figure 3C:
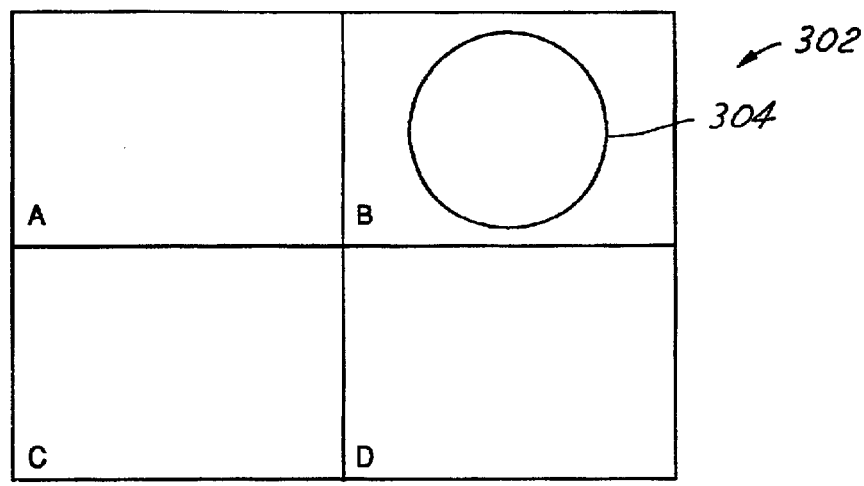
FIG. 3C is a top view of a monitor device according to the present invention.

According to the present invention, an area including the target surface of the monitor device is subjected to a SIMS procedure whereby the area is sputtered, detected and counted for time sufficient to sputter through a thickness of the target doping profile of interest. Preferably the monitor device 302, as shown in a top view in FIG. 3C is at least as large as the sputter beam size the outer portion of the beam being represented by line 304, the beam size preferably substantially covering a cross sectional area, e.g., B including the repeating semiconductor device structures of about 100 microns by 100 microns. Additionally, the monitor device may contain more than one surface area including the same or different repeating semiconductor device structures for analysis as shown in areas A, B, C, and D of monitor device 302. Further, the monitor device may contain multiple layers of repeating semiconductor structures that are the same or different in each level. For example, the monitor device may be repeatedly planarized to reveal another target surface in an underlying layer and again subjected to the SIMS procedure according to the present invention.

Preferably, a representative profile is developed from several substantially identical monitor patterns to account for statistical variations by well known statistical methods in, for example, manufacturing variables and SIMS sputtering and detection variables. Accordingly, the present invention, through the use of the representative device doping profile, enables analysis and evaluation of a doping profile in an individual device structures forming the monitor device.

Figure 4:
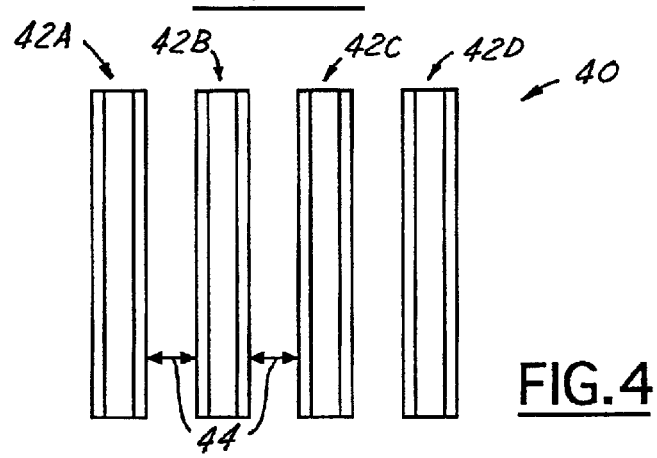
FIGS. 4 and 5 are exemplary top views of a monitor device according to the present invention.
Figure 5:
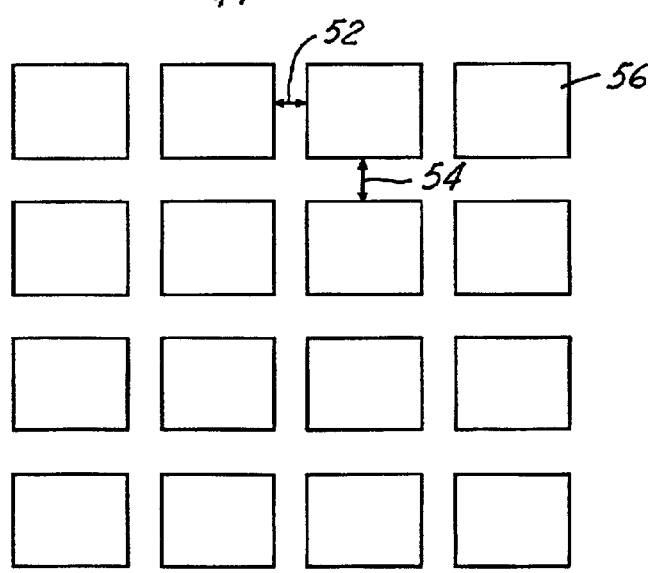

FIGS. 4 and 5 show a cross sectional top view of a representative portion of a monitor device including repeating semiconductor devices forming a portion of a monitor pattern. FIG. 4, for example, shows a top view of a portion of a monitor pattern 40 formed on a target surface showing a cross section of repeating LDD NMOS semiconductor devices structures after stripping overlying layers back to reveal the start of a doping profile at the polysilicon. The monitor pattern is regularly repeated, as in, for example a crystalline structure, in three dimensions, although only two dimensions are revealed at the target surface (in plane of drawing). For example, the cross sections of the repeating semiconductor structures are repeated in, for example, substantially identical rows e.g., 42A, 42B, 42C, 42D, which are spaced apart at a precisely known width 44. In another exemplary monitor pattern, a portion of which is shown in FIG. 5, the repeating patterns (rectangles) e.g., 56 represent a cross-sectional portion of a memory structure, for example, a DRAM structure, again stripped back to the start of a doping profile through a thickness within the DRAM structure to reveal a target surface. In FIG. 5, the monitor pattern is formed as an array of regularly repeating rectangles (DRAM structures) e.g., 56, again being spaced apart from one another by a precisely known distance e.g., 52 and 54.

It will be appreciated that according to the present invention, any shape of a semiconductor structure may be used to form a repeating pattern as long as the monitor device area includes a regularly repeating pattern in at least two dimensions. While the invention may be practiced to gain doping concentration information in one dimension, i.e., a plane, by having a repeating pattern in two dimensions, preferably, the repeating pattern regularly repeats in three dimensions to allow information to gathered that approximates a two dimensional doping profile for a three dimensional device. The term 'regularly repeating' herein means a shape with at least two dimensions that repeats itself in at least one direction along a length interval.

The preferred embodiments, aspects, and features of the invention having been described, it will be apparent to those skilled in the art that numerous variations, modifications, and substitutions may be made without departing from the spirit of the invention as herein disclosed and further claimed below.

What is claimed is:

1. A method of forming a SIMS monitor device for determining a 2-dimensional doping profile of a semiconductor device structure comprising the steps of:

providing a plurality of regularly repeating semiconductor structures each including a doping profile to form a monitor device including at least one layer of the regularly repeating semiconductor structures;

planarizing the monitor device through a thickness of the regularly repeating semiconductor structures to reveal a target surface overlying the doping profile to form a monitor pattern;

sputtering the target surface over a sputtering area including the monitor pattern through a thickness thereof while simultaneously detecting and counting over a time interval at least one type of species ejected from the target surface according to a secondary ion mass spectroscopy procedure (SIMS); and, determining a 2-dimensional doping concentration comprising the doping profile for an individual semiconductor structure comprising the plurality.

2. The method of claim 1, wherein the monitor pattern further comprises a regularly repeating, pattern in at least two planar dimensions of the doping profile.

3. The method of claim 1, wherein the planarizing step comprises a chemical mechanical polishing (CMP) step.

4. The method of claim 3, wherein the target surface comprises a polysilicon substrate including the doping profile.

5. The method according to claim 1, wherein the monitor device further comprises multiple layers of the regularly repeating semiconductor structures.

6. The method of claim 5, wherein the steps of planarizing and sputtering are carried out for at least one layer of the multiple layers.

7. The method of claim 1, wherein the target surface has an area sufficient to include the sputtering area.

8. The method of claim 1, wherein the regularly repeating semiconductor structures includes CMOS structures and memory structures.

9. The method of claim 1, wherein the monitor pattern forms regularly repeating rows.

10. The method of claim 1, wherein the monitor pattern form regularly repeating rows of regularly repeating rectangles.

11. A monitor device for analysis of a 2-dimensional doping profile of an individual semiconductor device structure according to a SIMS procedure comprising:

a planarized surface intersecting a plurality of regularly repeating semiconductor structures each comprising a doping profile to form a target surface said regularly repeating semiconductor structures included in at least one layer of the monitor device said monitor device being mountable in a secondary ion mass spectrometer for sputtering the target surface through a thickness to determine a 2-dimensional doping profile of an individual semiconductor structure.

12. The monitor device of claim 11, wherein the target surface further comprises a regularly repeating pattern in two planar dimensions of the doping profile formed by the planarized surface intersecting a plurality of regularly repeating semiconductor structures.

13. The monitor device of claim 11, wherein the target surface is disposed at about the start of the doping profile extending through a thickness perpendicular to the target surface.

14. The monitor device of claim 11, wherein the monitor device further comprises multiple layers of the regularly repeating semiconductor structures.

15. The monitor device of claim 11, wherein the target surface has an area sufficient to include a sputtering area.

16. The monitor device of claim 11, wherein the target surface forms a rectangular shape with a length of about 50 microns to about 300 microns on a side.

17. The method of claim 11, wherein the regularly repeating semiconductor structures include CMOS structures and memory structures.

18. The monitor device of claim 12, wherein the regularly repeating pattern approximates regularly repeating rows.

19. The monitor device of claim 12, wherein the regularly repeating pattern approximates regularly repeating rows of rectangular shapes.

* * * * *